United States Patent
Taguchi et al.

(10) Patent No.: US 6,501,775 B2
(45) Date of Patent: Dec. 31, 2002

(54) SEMICONDUCTOR LASER DRIVING CIRCUIT AND SEMICONDUCTOR LASER DEVICE

(75) Inventors: Toyoki Taguchi, Yokohama (JP); Makoto Morimoto, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 95 days.

(21) Appl. No.: 09/814,719

(22) Filed: Mar. 23, 2001

(65) Prior Publication Data

US 2001/0026566 A1 Oct. 4, 2001

(30) Foreign Application Priority Data

Mar. 24, 2000 (JP) ........................................ 2000-085113

(51) Int. Cl.[7] .............................. H01S 3/00; H01S 3/14; H01S 3/13
(52) U.S. Cl. ................................ 372/38.02; 372/29.015
(58) Field of Search .......................... 372/38.02, 29.015

(56) References Cited

U.S. PATENT DOCUMENTS

| | | | |
|---|---|---|---|
| 5,097,473 A | 3/1992 | Taguchi | |
| 5,506,853 A | 4/1996 | Tegge | |
| 5,579,329 A | 11/1996 | Taguchi | |
| 5,848,044 A | 12/1998 | Taguchi et al. | |
| 6,111,901 A | * 8/2000 | Taguchi et al. | ............... 372/38 |
| 6,388,521 B1 | * 5/2002 | Henry | ........................ 330/258 |

* cited by examiner

Primary Examiner—Eddie Lee
Assistant Examiner—Joseph Nguyen
(74) Attorney, Agent, or Firm—Oblon, Spivak, McClelland, Maier & Neustadt, P.C.

(57) ABSTRACT

There is provided an input circuit including a current/current conversion circuit and a current change-over circuit for converting an input control current into an inside control current; a control amplification circuit for amplifying a voltage corresponding to a difference current between an output current from the input circuit and a monitor current which is fed back from the photodetector for detecting a light output of the LD; an output circuit which is controlled with an output from the control amplification circuit; an offset compensation circuit for compensating for the offset generated between the input of the current/current conversion circuit and the output of the control amplification circuit, so that the offset is detected to compensate for the offset in the state in which the output of the control amplification circuit is cut off with the switch.

20 Claims, 5 Drawing Sheets

SEMICONDUCTOR LASER DRIVING CIRCUIT AND SEMICONDUCTOR LASER DEVICE

CROSS-REFERENCE TO RELATED APPLICATIONS

This application is based upon and claims the benefit of priority from the prior Japanese Patent Application No. 2000-085113, file Mar. 24, 2000, the entire contents of which are incorporated herein by reference.

BACKGROUND OF THE INVENTION

The present invention relates to a semiconductor laser driving circuit for driving a semiconductor laser used in an optical disk or the like in accordance with an input control current.

In optical disks, laser printers, light communication systems or the like, an input control current corresponds to information to be recorded or transmitted is supplied from the outside of an integrated circuit, and a semiconductor laser driving circuit is used which is constituted of an integrated circuit for supplying a driving circuit to the semiconductor laser in accordance with the input control current. As a known example of such semiconductor laser driving circuit, for example, there is available U.S. Pat. No. 5,097,473 (Inventor: TAGUCHI) and U.S. Pat. No. 5,579,329 (Inventor: TAGUCHI).

The semiconductor driving circuit in these known examples has a structure such that a light output of the semiconductor laser is detected with a photodetector and a monitor current thus obtained is compared with the input control current to carry out a wide-band feed back control so that a difference between the two becomes minimum to drive the semiconductor laser. In these structures, there arises an offset at an input circuit and a control amplification circuit for supplying to an output circuit a voltage according to a difference current between a control current given to an input circuit which receives a current for driving the semiconductor laser and via the input current and a monitor current of the light output of the semiconductor laser. The offset becomes particularly conspicuous when the circuit is constituted with the CMOS transistor.

When the above offset is present in the semiconductor laser driving circuit, the following problem arises, for example, in the case of the optical disk device. In the beginning, this offset becomes a large error which cannot be ignored at the reproduction time at which the semiconductor laser is set to a low output light amount. For example, when the output light amount of the semiconductor laser becomes the predetermined value or more with this offset, information recorded on the optical disk is gradually erased. Then, when the output light amount of the semiconductor laser becomes less than the predetermined value, the S/N of the reproduction signal is lowered with the result that a normal reproduction becomes impossible.

On the other hand, it is desired that the semiconductor laser driving circuit is all constituted of CMOS transistors in order to meet with a strong demand on the lower consumption of power, and a cost reduction on the market of optical disk devices. However, in the CMOS transistor, the offset voltage of the input circuit or the control amplification circuit is extremely large as compared with the conventional bipolar transistor circuit with the result that the above problem becomes conspicuous. Thus, it is almost impossible to provide an overall CMOS transistor structure unless this offset is decreased.

Furthermore, in order to correspond to each kind of specifications of the optical system of the optical disk device, for example, the kind of the semiconductor laser and the difference in the monitor amount or the like peculiar to an optical channel which leads to the photodetector for the monitor from this semiconductor device, a loop gain of the feedback loop can be adjusted in a wide range, and it is required to increase and decrease the magnitude of the input control current from the outside in accordance with the magnitude of the monitor current. However, in the semiconductor laser driving circuit from the above known embodiment, since the loop gain variation capability by the control amplification circuit is limited, it is difficult to sufficiently cope with the loop gain. Furthermore, there is a problem in that when an attempt is made to increase and decrease the magnitude of the input current in accordance with the magnitude of the monitor current, an increase in the consumed power and a decrease in the transmission S/N of the input control current is invited.

BRIEF SUMMARY OF THE INVENTION

An object of the present invention is to provide a semiconductor laser drive circuit and a semiconductor laser device which can stably drive the semiconductor laser, for example, in the entire CMOS transistor circuit structure by sufficiently decreasing offset.

Furthermore, another object of the present invention is to provide a semiconductor laser device which can widely adjust a loop gain of a feed-back loop, and which can be easily controlled in conformity with the magnitude of a monitor current.

According to a first aspect of the present invention, there is provided a semiconductor laser driving circuit which drives a semiconductor laser in accordance with an input control current supplied from the outside, the device comprising:

an input circuit configured to convert the input control current into a control current inside of an integrated circuit;

a control amplification circuit configured to amplify a voltage corresponding to a difference current between the control current output from the input circuit and a monitor current corresponding to a light output of the semiconductor laser fed back from a photodetector for detecting the light output;

an output circuit configured to supply a drive current to the semiconductor laser in correspondence to an output from the control amplification circuit;

a first switch configured to interrupt the input control current to the input circuit;

a second switch configured to cut off the output of the control amplification from an input of the output circuit;

an offset compensation circuit configured to detect an offset generated in a signal channel up to the output of the control amplification circuit from an input of the input circuit in the state in which the first switch is operated to interrupt the input control current to the input circuit while the second switch is operated to cut off the output of the control amplification circuit from the input of the output circuit, upon a drive instruction of the semiconductor laser being given and compensate for the offset on the basis of the detection result.

According to a second aspect of the present invention, there is provided a semiconductor laser device for driving a semiconductor laser in accordance with an input control current supplied from the outside, the device comprising:

a semiconductor laser;

a photodetector configured to detect a light output of the semiconductor laser;

a current/current conversion circuit configured to convert the input control current into a control current inside of an integrated circuit;

a current change-over circuit configured to change over and output the control current output from the current/current conversion circuit at a conversion ratio which is controlled on the basis of the control signal from the outside;

a control amplification circuit configured to amplify a voltage corresponding to a difference current between a control current output from the current change-over circuit and a monitor current corresponding to the light output of the semiconductor laser fed back from photodetector; and an output circuit configured to supply a drive current to the semiconductor laser in correspondence to an output from the control amplification circuit;

wherein the current/current conversion circuit, the current change-over circuit, the control amplification circuit, and the output circuit are constituted of the integrated circuit; and the device further comprising:

a current/voltage conversion resistor configured to convert the difference current between the control current and the monitor current into a voltage to supply the difference current to a voltage to supply the voltage to the control amplification circuit.

In the semiconductor laser driving circuit and the semiconductor laser device which are constituted in this manner, even when the offset is effectively decreased which is generated in a signal channel from the input of the input circuit up to the output of the control amplification circuit and circuits are entirely constituted of CMOS transistors for the decrease of consumed power and a cost reduction, the output light amount of the semiconductor laser can be stably controlled to a value corresponding to the input control current. Consequently, in the case where the semiconductor laser driving circuit and the semiconductor laser device are applied to the drive of the semiconductor laser for use in the recording and reproduction of, for example, an optical disk, it becomes possible to avoid such problems as damage and erasure of recorded information on the optical disk resulting from a large deviation of the output light amount from the desired value and a decrease in the S/N of the reproduction signal.

Furthermore, according to a third aspect of the present invention, there is provided a semiconductor laser device for driving a semiconductor laser in accordance with an input control current supplied from the outside, the device comprising:

a semiconductor laser;

a photodetector configured to detect a light output of the semiconductor laser;

an input circuit configured to convert the input control current into a control current inside of an integrated circuit;

a control amplification circuit configured to amplify a voltage corresponding to a difference current between the control current output from the input circuit and a monitor current corresponding to the light output of the semiconductor laser fed back from the photodetector;

an output circuit configured to supply a drive current to the semiconductor laser in correspondence to an output from the control amplification circuit;

a first switch configured to interrupt the input control current to the input circuit;

a second switch configured to cut off the output of the control amplification circuit from an input of the output circuit; and an offset compensation circuit configured to detect an offset generated in a signal channel up to the output of the control amplification circuit from an input of the input circuit in the state in which the first switch is operated to interrupt the input control current to the input circuit while the second switch is operated to cut off the output of the control amplification circuit from the input of the output circuit, upon a drive instruction of the semiconductor laser being given and compensate for the offset on the basis of the detection result.

Furthermore, the input circuit further comprises a current change-over circuit for outputting an output current from the current/current conversion circuit by changing over the current at a conversion ratio which is controlled on the basis of the control signal from the outside. With the addition of such current change-over circuit, the output current of the current change-over circuit, namely the input voltage to the control amplification circuit can be largely changed without enlarging the set range of the input control current. Accordingly, it is possible to correspond to optical systems for output light monitors with various specifications provided in the optical disk device without depreciating the control precision of the drive current of the semiconductor laser. At the same time the problems such as increase in the consumed power and a reduction in the transmission S/N can be also settled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram showing a detailed structure of an offset compensation circuit according to the embodiment of the present invention.

FIGS. 3A through 3E are timing charts for explaining an operation of the offset compensation circuit according to the embodiment; FIG. 3a is a view showing a drive instruction signal P1 of the laser driving circuit; FIG. 3B is a view showing an offset voltage ΔV; FIG. 3C is a view showing an output signal P2 of a comparator 60; and FIG. 3D is a view showing an output signal P3 of a window comparator 62; and FIG. 3E is a view showing a switch control signal P4, respectively.

DETAILED DESCRIPTION OF THE INVENTION

Figure 1:
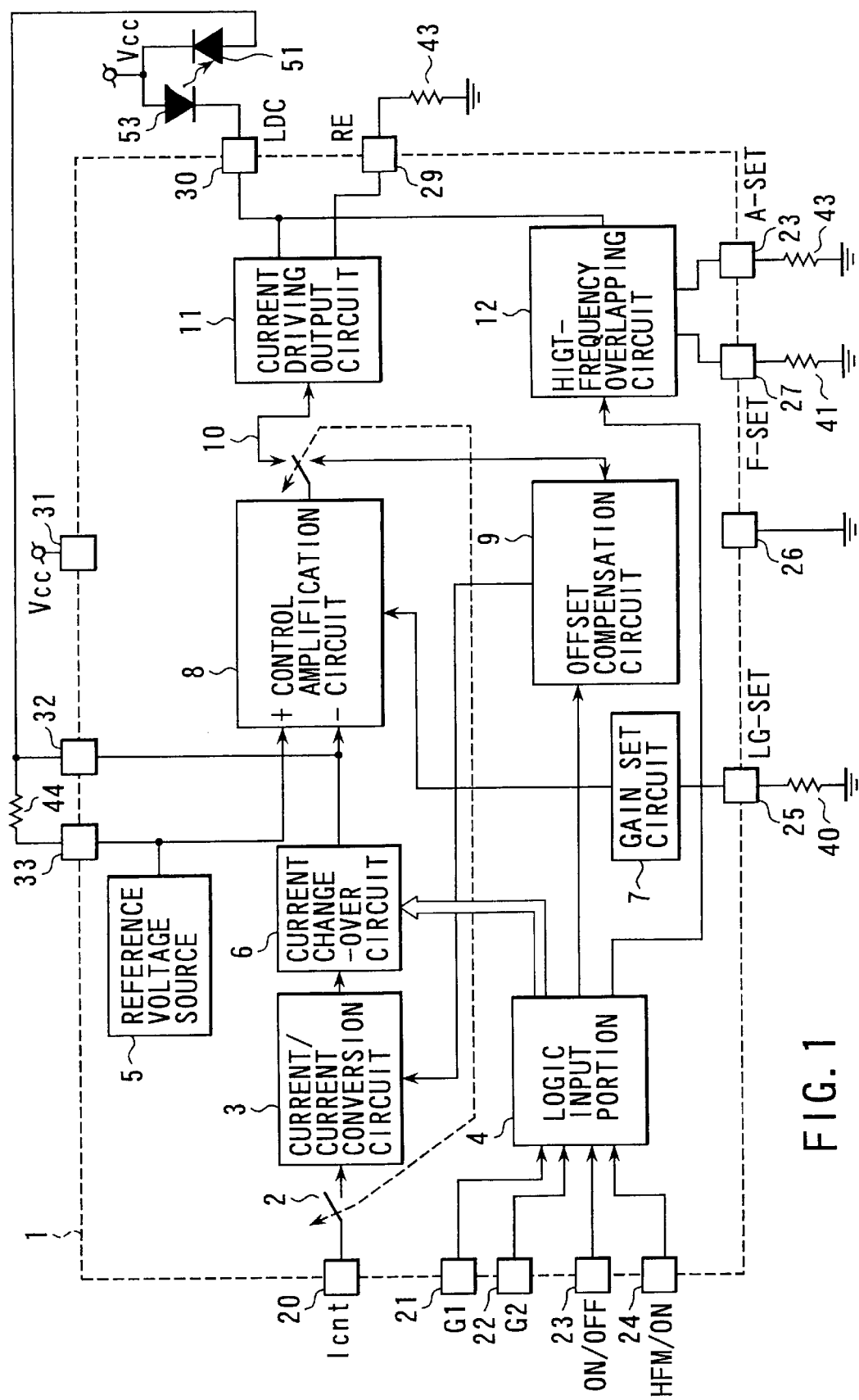
FIG. 1 is a block diagram showing a structure of a semiconductor laser device according to one embodiment of the present invention.

Embodiments of the present invention will be explained by referring to the drawings.

(Overall Structure of Semiconductor Laser Device)

FIG. 1 is a block diagram showing a structure of a semiconductor laser device according to one embodiment of the present invention. In FIG. 1, a semiconductor laser driving circuit (hereinafter referred to as an LD driving circuit) 1 is constituted of one chip integrated circuit, and has a first switch 2, a current/current conversion circuit 3, a logic input portion 4, a reference power voltage source 5, a current change-over circuit 6, a gain-set circuit 7, a control amplification circuit 8, an offset compensation circuit 9, a second switch 10, a current driving output circuit 11 and a high frequency overlapping circuit 12.

Furthermore, the LD drive circuit 1 has, as external connection terminals of the integrated circuit, a control current input terminal 20, a current conversion gain-set terminals 21 and 22, a light amount control ON/OFF control terminal 23, a high frequency overlapping ON/OFF terminal 24, a loop gain-set terminal 25 and an GND (ground) terminal 26, a high frequency overlapping frequency setting terminal 27, a high frequency overlapping amplitude setting terminal 28, a drive sensitivity setting terminal 29, an LD driving terminal 30, a power source supply terminal 31, a monitor current feedback terminal 32, a reference voltage terminal 33.

A cathode terminal of the semiconductor laser (hereinafter referred to as LD) is connected to the LD driving terminal 30, and an anode terminal of the LD 50 is connected to the power source Vcc while the anode terminal thereof is also connected to the cathode terminal of the photodetector 51 for the light output monitor comprising a photodiode arranged so as to receive the light output of the LD 50. On the other hand, the anode terminal of the photodetector 51 is connected to the monitor current feedback terminal 32.

Furthermore, as an external device for an integrated circuit which constitutes the LD drive circuit 1, on the loop gain terminal 25, the high frequency overlapping frequency setting terminal 27, the high frequency overlapping amplitude setting terminal 28, and the drive sensitivity setting terminal 29, setting resistors 40, 41, 42, and 43 are connected for setting respective parameters, and between the feedback terminal 32 of the monitor current and the reference voltage terminal 33, a current/voltage conversion resistor 44 is connected for converting a difference current between the control current and the monitor current into a voltage between the monitor current feedback terminal 32 and the reference voltage terminal 33.

(Schematic Operation of the Semiconductor Laser Device)

Next, before explaining a detailed structure of each portion of FIG. 1, a schematic operation of the semiconductor laser device as a whole will be described.

An output light of the LD 50 is detected with a photodetector 51, and a monitor current is output corresponding to the light output of the LD 50 from the photodetector 51. This monitor current is fed back (negative feed back) to a reverse input terminal of the control amplification circuit 8 via a monitor current feedback terminal. The reverse input terminal of the control amplification circuit 8 is biased via the reference voltage terminal 33, the current/voltage conversion resistor 44 and the monitor current feedback terminal 32.

On the other hand, the input control terminal input from the outside of the LD drive circuit via the control current input terminal 20 is input to the current/current conversion circuit 3 via a first switch 2. After the current is converted into an inside current (inside feedback current in the current/current conversion circuit 3) of the integrated circuit in this current/current conversion circuit 3, the current is changed over at a current conversion ratio controlled with the logic input portion 4 in the current change-over circuit 6.

Consequently, a difference current between the control current from the current change-over circuit 6 and the monitor current from the photodetector 51 is converted into a voltage (an error voltage) at a current/voltage conversion resistor 44, and a feedback control is carried out to the control amplification circuit 8 so that the error voltage generated between both terminals of the current/voltage conversion resistor 44. The output from the control amplification circuit 8 is input to the current drive output circuit 11 comprising a current amplifier via the second switch 10, and is current amplified, then is supplied to the LD 50 via the LD drive terminal 30 as a drive current.

Here, the loop-gain can be largely taken by changing the outside attachment current/voltage current thereby making it possible to correspond to each kind of optical systems having different specifications. Furthermore, in the current change-over circuit 6, it becomes possible to correspond to a monitor current values having various magnitudes output from the current detector 51 by rendering variable a conversion ratio of the input and output current via the terminals 21 and 22 with a logic input portion 4 in accordance with current gain-set signals G1 and G2 input via the terminals from the outside with the result that the universal usage of the device is improved.

On the other hand, an offset generated in the signal channel from the input of the current/current conversion circuit 3 up to the output of the control amplification circuit 9 is compensated (removed) with the offset compensation circuit 9. In a period immediately after an LD drive instruction is given from the logic input portion 4 in the beginning, this offset compensation circuit 9 incorporates an output voltage of the control amplification circuit 8 in the state in which the first switch 2 is turned off to interrupt the input control current to the current/current conversion circuit 3 while the second switch 2 is connected to the input side of the offset compensation circuit 9 to cut off the output of the control amplification circuit 8 from the input of the current drive output circuit 11 thereby completely turning off the current drive output circuit 11, and fetching the output voltage of the control amplification circuit 8. Then the offset compensation circuit 9 detects the offset by feeding back the current to the current/current conversion circuit 3 until the output voltage becomes a predetermined reference voltage (an intermediate voltage: Vcc/2).

Then, thereafter, this offset detection result, namely, a feed-back current to the current/current conversion circuit 3 is held to turn on the first switch 2 to give an input control current to the current/current conversion circuit 2 while the output of the control amplification circuit 8 is transmitted to the current drive output circuit 11 by changing over the second switch 2 to the input side with the result that a drive current is supplied to the LD 50 via the terminal 50 from the current drive output circuit 11 to drive the LD 50. As a consequence, the above offset is canceled with the result that the difference current between the control signal current and the monitor current becomes extremely small and accurate light output can be obtained in accordance with the input control current.

Incidentally, the high frequency overlapping circuit 12 overlaps a high frequency current having an appropriate frequency and amplitude with a drive current supplied to the LD for returning to the LD 50 to suppress light noise. Since this technique is already known, detailed explanation thereof is omitted.

(Offset Compensation Circuit 9)

Figures 2, 3B:
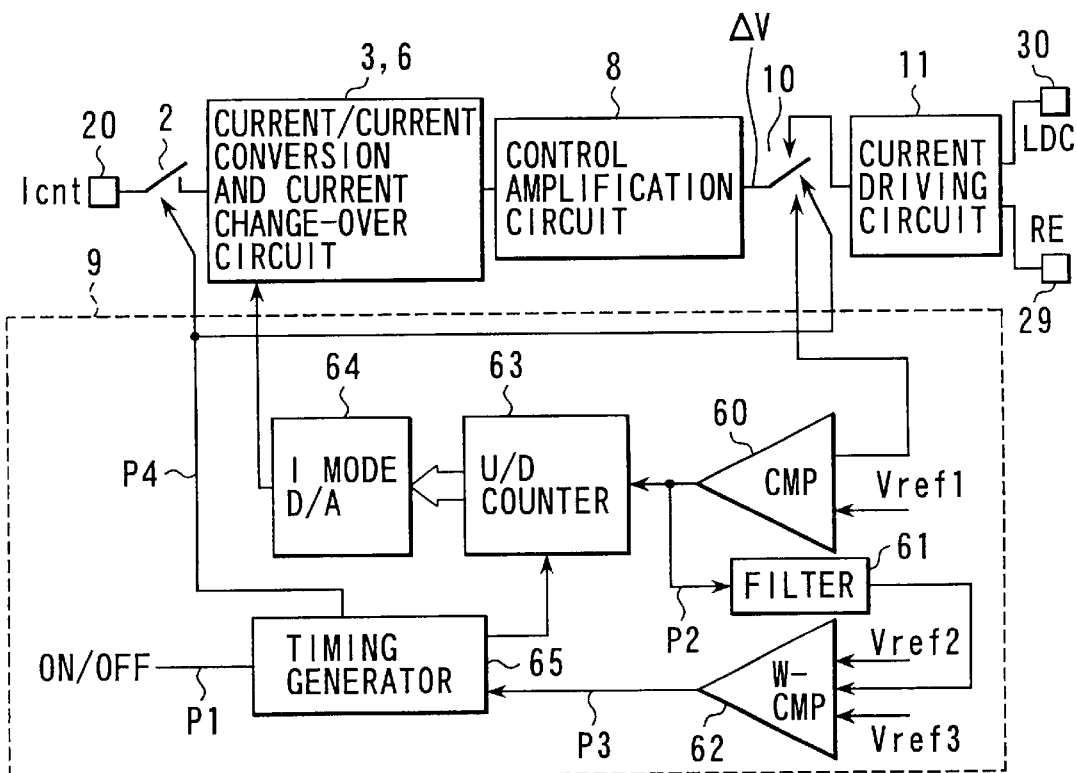

By using FIGS. 2, 3A through 3E, more detailed structure and an operation of the offset compensation circuit 9 will be explained. FIG. 2 is a block diagram showing a detailed structure of the offset compensation circuit. FIGS. 3A through 3E are timing charts thereof.

As shown in FIG. 2, the offset compensation circuit 9 comprises a comparator (a first comparator) 60 for comparing an output voltage of the control amplification circuit 8 with the reference voltage (an intermediate potential: Vcc/2) Vref1 to output an output signal with a polarity in accordance with the magnitude of the two voltages; a filter (for example, a low pass filter) 61 for filtering an output signal P2 of the comparator 60; a window comparator (a second comparator) 62 for comparing the output voltage of the filter 61 with two reference voltages Vref2 and Vref3 to judge whether or not the output voltage is within the predetermined range between the two reference voltages Vref2 and Vref3 to determine the offset detection termination timing; an up/down counter 63 for carrying out an up count or a down count in accordance with an output signal polarity of the comparator 60; a D/A converter 64 for converting an output digital value of the up down counter 63 into an analog current; and a timing generator 65 for generating a switch control signal P4 for controlling a first switch 2 and a second switch 10 in accordance with an LD drive instruction signal P1 and an output P3 of the window comparator 62 while generating a clock supplied to the up-down counter 63.

Next, an operation of the offset compensation circuit 9 will be explained by using timing charts of FIGS. 3A through 3E. The timing generator 65 receives an LD drive instruction signal P1 to turn off the first switch 2 and connect the second switch 10 the input side of the offset compensation circuit 9, and the supply of the clock to the up down counter 63 is started. It is supposed that the initial value is preset so that the output analog value of the D/A converter 64 becomes zero in the state before the start of the clock supply.

Here, when it is supposed that the offset (the offset voltage) of ΔV voltage is present in the output voltage of the control amplification circuit 8, the output voltage having the offset ΔV is compared with the reference voltage Vref1 with the comparator 60, the output signal of the comparator 60 becomes a polarity corresponding to the magnitude of these voltages. The up/down counter 63 counts up and counts down a clock supplied from the logic input portion 4 in accordance with the output signal polarity of the comparator 60. That is, in the case where the offset voltage ΔV is lower than the reference voltage Vref1, the comparator 60 outputs a low level signal P2 and the up/down counter 63 carries out an up count. When the offset voltage is increased, and becomes higher than the reference voltage Vref1, the comparator 60 outputs a high level signal P2, and the up/down converter 63 carries out a down count. An output digital value of the up/down counter 63 is converted into an analog current with the D/A converter 64 and this current is fed back to the current/current conversion circuit 3, so that the offset ΔV is controlled in a decreasing direction.

In this manner, the offset ΔV is gradually directed to Vref1 along with the count operation of the up/down counter 63. When the offset ΔV is converged in the vicinity of Vref1, ΔV is oscillated centering upon the reference voltage Vref1, so that a pulse row is generated in the output P2 of the comparator 60 along with it. Various methods are considered as means for determining that the offset ΔV is converged in the vicinity of Vref1. Here, the output pulse of the comparator 60 is filtered (averaged) with a filter 61 to judge the output of the filter 61 with the window comparator 60.

A pulse row is continuously generated in the output P2 of the comparator 60, and an output of the filter 61 becomes an intermediate level between two reference voltages Vref2 and Vref3, so that an output P3 of the window comparator 62 is changed from a low level to a high level at the time when a state is generated in which the offset is sufficiently canceled. When the output of the window comparator 62 becomes a high level, the timing generator 65 suspends the supply of the clock to the up/down counter 63 to hold the digital value while the first switch 2 is turned on, and the second switch 10 is connected to the input side of the current drive output circuit 11. As a consequence, the LD drive circuit 1 drives the LD 50 in the state in which the offset ΔV is held in the state of approximately zero.

(Control Amplification Circuit 8)

Figure 4:
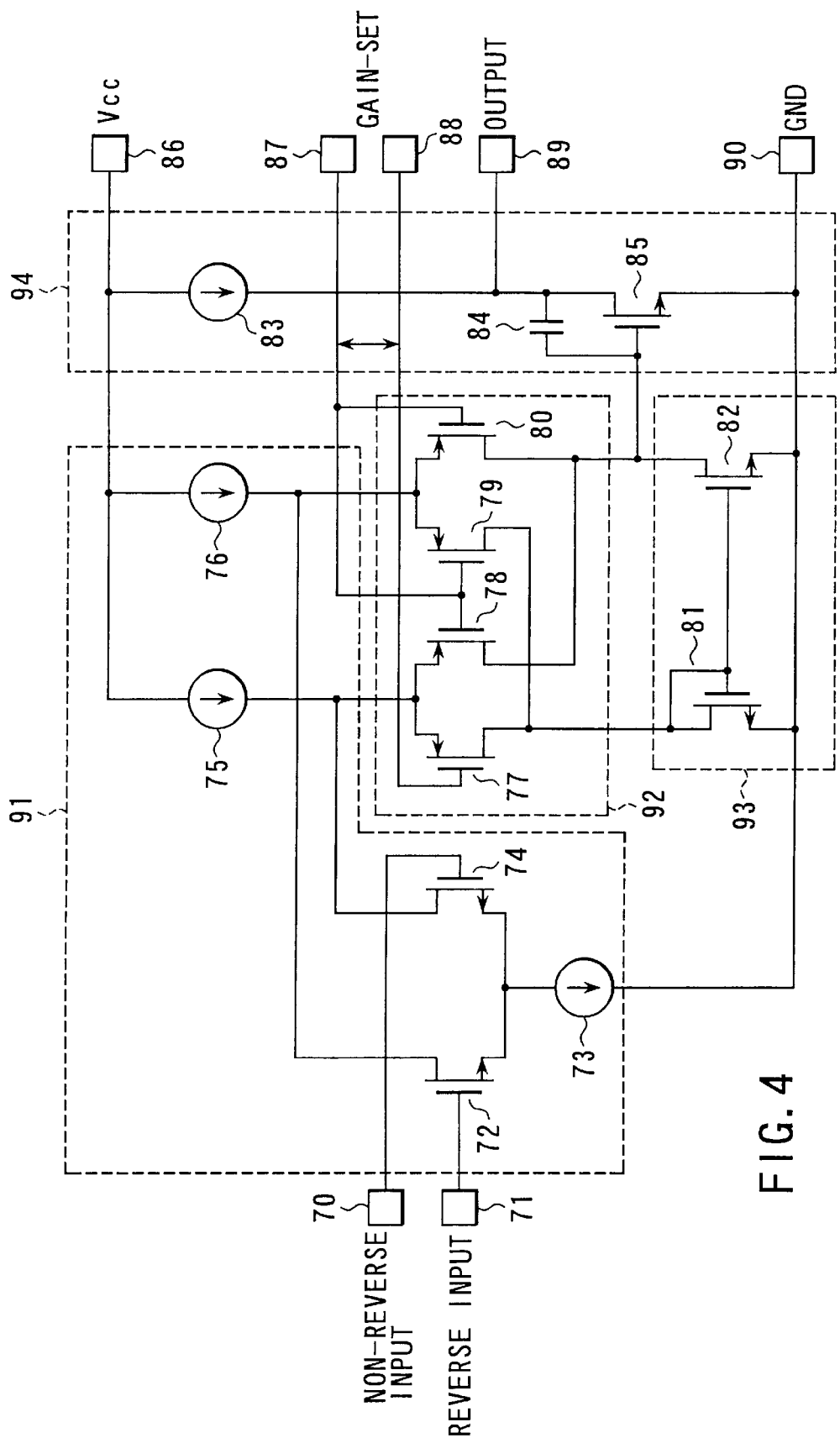
FIG. 4 is a circuit diagram showing a detailed structure of a control amplification circuit according to the embodiment.

In the case where an attempt is made to carry out a wide-band feedback control with a structure shown in FIG. 1, since a delay in the control amplification circuit 8 becomes a large problem, it is desired that the number of steps of the amplification step is minimum in the control amplification circuit 8. FIG. 4 is a diagram showing a specific circuit of the control amplification circuit 8 having a gain variable function.

The control amplification circuit 8 shown in FIG. 4 comprises a differential amplifier 91 having a pair of active loads for amplifying a voltage corresponding to a difference current between a control current output from the current change-over circuit 6 of FIG. 1, and a monitor current of a light output of the LD 50; a current distribution circuit 92 for distributing at a desired distribution ratio a current input at a pair of current input terminals from a pair of active loads of the differential amplifier 91 to a pair of current output terminals; a difference current detection circuit 93 for detecting and outputting an output current from the pair of current output terminals; and an output section 94 for outputting a difference voltage detected with the difference voltage detection circuit 93 into a voltage.

When explained further in detail, the differential amplifier 91 comprises a differential pair MOS transistors 72 and 74, a current source 73, and current sources 75 and 76. The differential pair MOS transistors 72 and 74 are such that each of the gates is connected to the non-reverse input terminal 70 and the reverse input terminal 71 respectively, and each of the sources is commonly connected to one terminal of the current source 73. Each of the drains is connected respectively to each one terminal of the current sources 75 and 76 which are a pair of active loads. The non-reverse input terminal 70 is connected to the reference voltage source 5 and the reference voltage terminal 33 while the non-reverse input terminal 71 is connected to the output terminal of the current change-over circuit 6 and the monitor feedback terminal 32. The other terminal of the current source 73 is connected to the GND (ground) terminal 90 while the other terminal of the current sources 75 and 76 is connected to the terminal 86 of the power source Vcc.

The current distribution circuit 92 is a so-called Gilbert cell and comprises two sets of differential pair MOS transistors 77 and 78, and 79 and 80, and is constituted in such a manner that the distribution ratio of two current output is changed in accordance with the gain-set signal input via the terminals 87 and 88 from the gain-set circuit 7. That is, each of the sources of the differential pair MOS transistors 77 and 78 and each of the sources of the differential pair MOS transistors 79 and 80 are commonly connected to the current power sources 75 and 76 respectively which are active loads in the differential amplifier 91. The gate of the MOS transistors 77 and 80 are connected to the terminal 88 while the gate of the MOS transistors 78 and 79 are commonly connected to the terminal 87 respectively. The drains of the MOS transistors 77 and 79 and the drains of the MOS transistors 78 and 80 are commonly connected respectively to provide a first and a second current output terminals of the current distribution circuit 92.

To the first current output terminal of the current distribution circuit 92, the drain and the gate of the diode connected MOS transistor 81 of the difference current detection circuit 93 is connected. To the second current output terminal of the current distribution circuit 92, the drain of the other MOS transistor 82 of the difference current detection circuit 93 is connected. Each of the sources of the MOS transistors 81 and 82 is connected to the GND terminal 90.

MOS transistors 81 and 82 form a current mirror, so that current from the first current terminal of the current distribution circuit 92 flows into the MOS transistor 81 and the same current flows into the drain of the MOS transistor 82. As a consequence, namely, a difference current between the current which flows into the drain of the MOS transistor 82 and the output current from the second current output terminal of the current distribution circuit 92, namely, a difference current in the output current from the first and the second current output terminals of the current distribution circuit 92 can be detected.

A difference current detected with the difference current detection circuit 93 is converted into the voltage with the output section 94 constituted of the current source 83, the capacitor 84 and the MOS transistor 85, and is output from the output terminal 89.

Thus, the control amplification circuit 8 shown in FIG. 4 can realize an amplification function and a gain variable function with a structure having a small delay which comprises only one step of a differential amplifier 91 as an amplification step by inserting the current distribution circuit 92 for changing the current distribution ratio by the gain-set signal output from the Gain-set circuit 7 of FIG. 1 and the difference current detection circuit 93 between the active loads (current sources 75, 76) of the differential amplifier 91 and the GND terminal 90 to provide a gain variable function.
(Concerning (Input Circuit (Current/Current Conversion Circuit 3 and Current Change-Over Circuit 6))

In the LD driving circuit 1 according to this embodiment, an input circuit for receiving an input control current from the outside comprises a current/current conversion circuit 3 and a current change-over circuit 6. Although the input control current is given to the current/current conversion circuit 3 via a first switch 2 from the control current input terminal 3, this input control current is generated as an output current of the D/A converter outside of the LD driving circuit 1 which is an integrated circuit. Consequently, because of the limited bit precision of the D/A converter, the current setting precision is depreciated when an attempt is made to enlarge the setting range of the input control current so as to correspond to the monitor current of the photodetector 51 in the case where an optical system for output light monitor with various specifications is used in the optical disk device. That is, suppose that the D/A converter is an 8 bit device, and is constituted in such a manner that an input control current from 0 to 4 mA can be output. In the case where the monitor current shown FIG. 1 is, for example, 2 mA, only ½ of the output of the D/A converter is used (only 7 bits portion of the D/A converter is used). On the contrary, when the monitor current is 12 mA, there arises a problem in that the bit number of the D/A converter becomes insufficient. In this case, it is necessary to provide a 12 bits D/A converter so that there arises a problem that the usage efficiency is poor.

Figure 5:
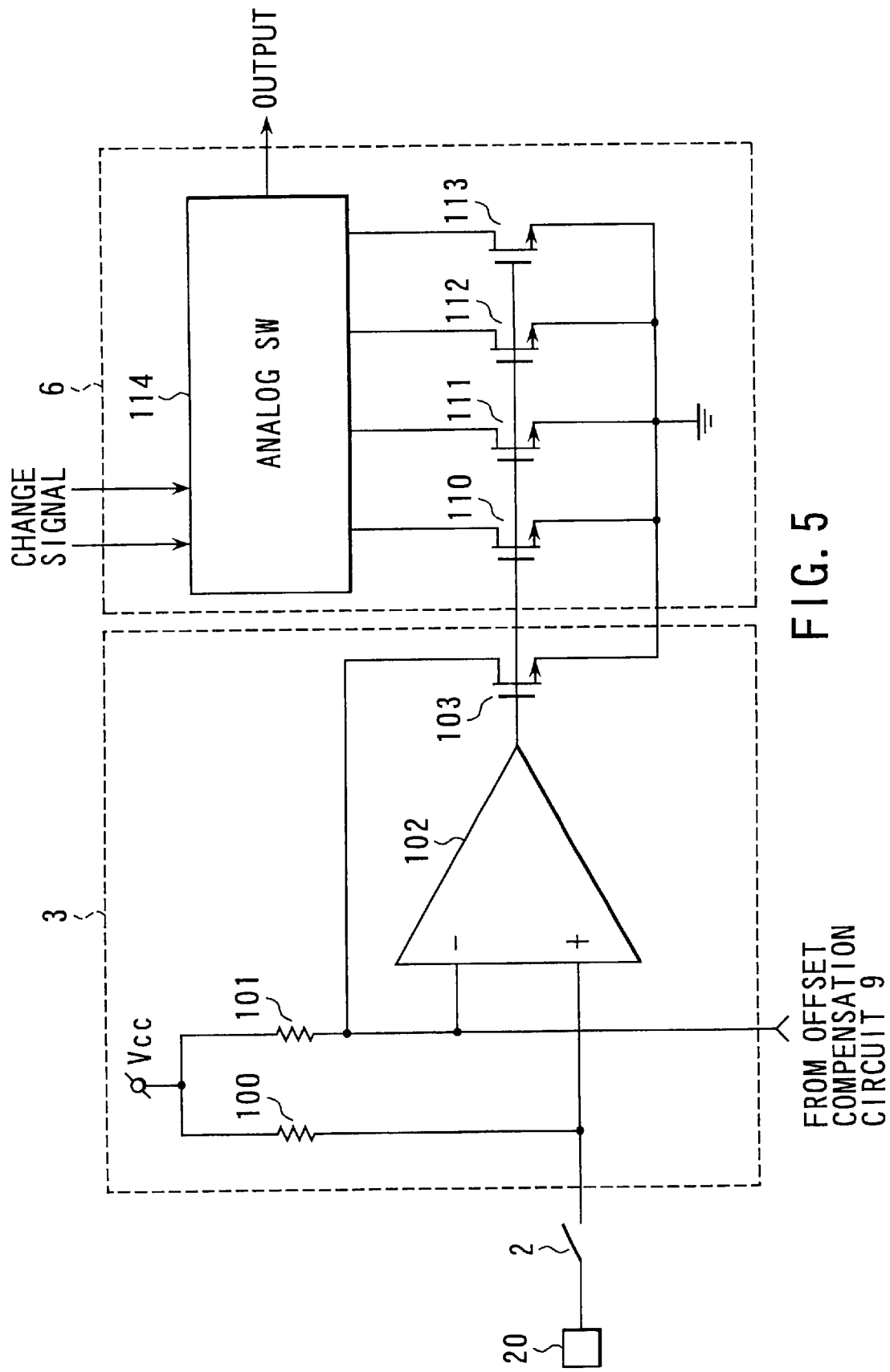
FIG. 5 is a circuit diagram showing a detailed structure of a current/current conversion circuit and a current change-over circuit according to the embodiment.

FIG. 5 is a view showing a specific circuit of the current/current conversion circuit 3 and the current change-over circuit 6 which is constituted to avoid such a problem. In FIG. 5, the current/current conversion circuit 3 comprises two current/current conversion resistors 100 and 101, the calculation amplifier 102 and a MOS transistor 103. The current/voltage conversion resistor 100 is connected between the other terminal of the first switch 2, the non-reverse input terminal of the calculation amplifier 102 and the power source Vcc to convert the input control current input via the first switch 2 from the control current input terminal 20 to a voltage. The other current/voltage conversion resistor 101 is connected between the power source Vcc and the non-reverse input terminal of the calculation amplifier 102 to convert the inside feedback current to a voltage. The MOS transistor 103 generates the inside feedback current by the connection of the gate to the output terminal of the calculation amplifier 102 and the connection of the drain to the reverse input terminal of the calculation amplifier 102.

Since this current/current conversion circuit 3 functions in such a manner that the non-reverse input terminal and the reverse input terminal becomes the same potential, namely a difference in the voltage drop between the two current/voltage conversion resistors 100 and 101 becomes zero so that the current same as the input control current normally flows through the drain of the MOS transistor 103.

However, an output terminal of the offset compensation circuit 9 of FIG. 1 (an output terminal of the D/A converter 64 of FIG. 2) is connected to the reverse input terminal of the calculation amplifier 102, so that a sum of the inside feedback current and a current fed back from the offset compensation circuit 9 flows so that the output current of the current/current conversion circuit 3 changes not only with the input control current but also with the output current from the offset compensation circuit 9 thereby making it possible to adjust the offset.

On the other hand, the current change-over circuit 6 comprises a plurality of MOS transistors 110, 111, 112, and 113, and an analog switch (a current switch) 114. The MOS transistors 110, 111, 112 and 113 form a current mirror together with the MOS transistor 103 by the common connection of the MOS transistor 103 and the gate with a drain current flows which is the same as the drain current which flows in the MOS transistor 103.

An analog switch 114 changes over the output number of the MOS transistors 110, 111, 112 and 113 connected to the output terminal of the current change-over circuit 6 in accordance with a current change-over signal supplied from the logic input portion 4 on the basis of the current conversion gain-set signals G1 and G2 input to the current conversion gain-set terminals 21 and 22 of FIG. 1. With such a structure, the output current of the current change-over circuit 6 can be changed over to an arbitrary integer number times of the control current generated in the current/current conversion circuit 3 in accordance with the current change-over signal. Consequently, an output current of the current change-over circuit 6 can be largely changed without enlarging the set range of the input control current thereby making it possible to correspond to the optical system for the output monitor with various specifications without depreciating the precision of the LD drive current.

(Application Example)

Next, there will be explained an optical disk device shown in FIG. 6 using an LD driving circuit according to the present invention.

Figure 6:
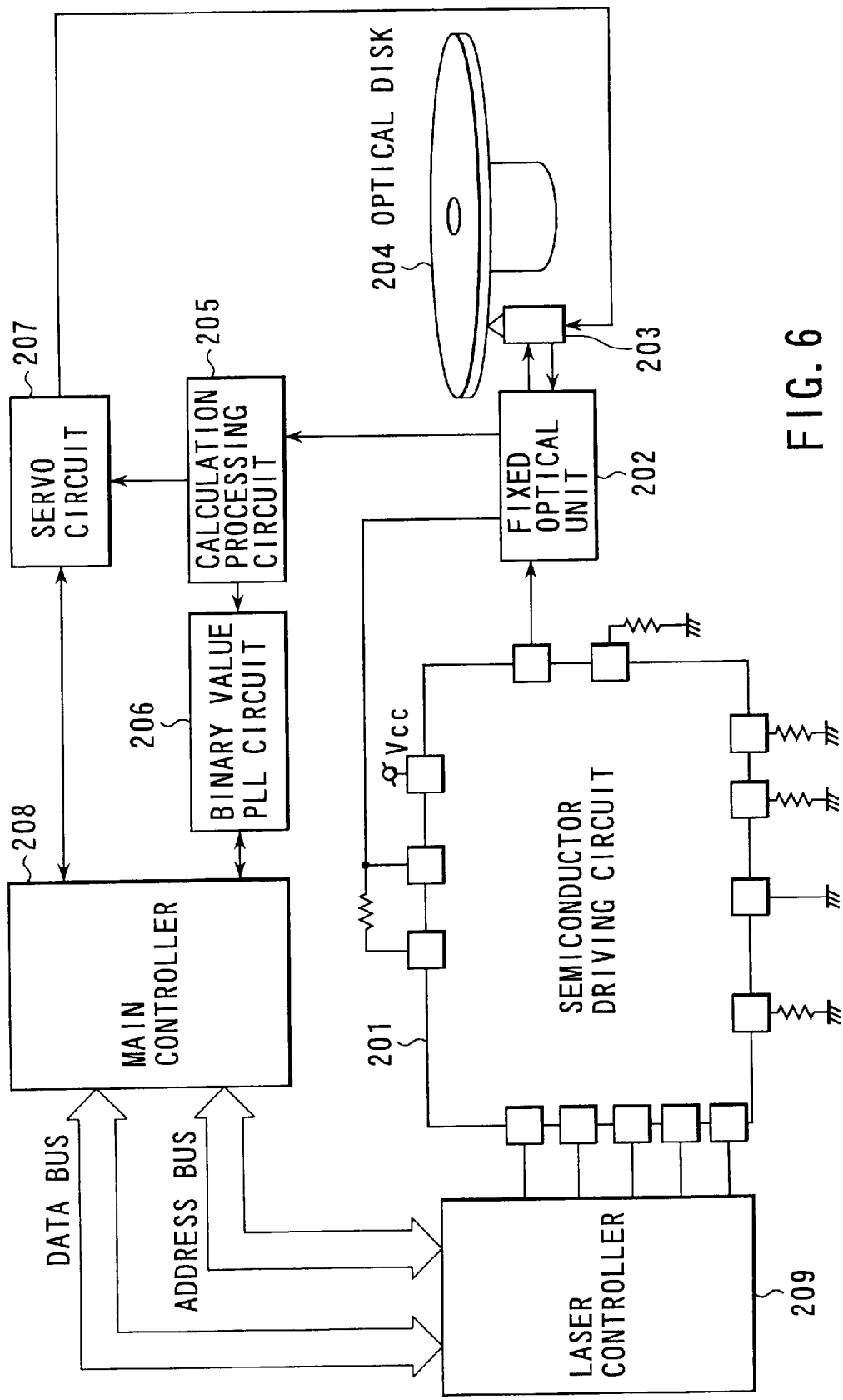
FIG. 6 is a block diagram showing a structure of an optical disk device to which the semiconductor laser driving circuit of the present invention is applied.

In FIG. 6, the semiconductor laser driving circuit (the LD driving circuit) 201 is the same as the LD driving circuit 1 shown in FIG. 1. The LD 50 and the photodetector 51 for the light output monitor shown in FIG. 1 are provided in the fixed optical unit 202. Although the details of the inside of the fixed optical unit 202 are not shown, an output light of the LD is led to the moving optical head 203 via optical elements such as a collimator lens, a complex prism, a galvano mirror or the like.

The moving optical head 203 comprises an object lens for converging and applying light beams on the optical disk 204 which is rotated with a spindle motor, and an actuator for moving the object lens in a focus direction and in a tracking direction or the like, which is capable of moving in a radius direction of the optical disk 204.

When the information recorded on the optical disk 204 is reproduced, a low-power laser beams lower than the laser beams for recording are output as reading beams to be introduced from the fixed optical unit 202 to the moving optical head 203 to be applied as a fine light spot onto the optical disk 4 with the moving optical head 203. Reflection light from the optical disk 204 is introduced to the fixed optical unit 202 via the moving optical head 203. In the fixed optical unit 202, reflection light introduced from the moving optical head 203 is separated from the incident light at the complex prism to be converged onto the photodetector for reproduction with a hologram device for reproduction.

An output of the photodetector for reproduction is input to the calculation processing circuit 205 which comprises a preamplifier and an addition and subtraction circuit as a main elements so that a reproduction information signal and a servo signal for focus servo and tracking servo are generated. The servo signal is introduced to the servo circuit 207 so that the servo circuit 207 controls the moving optical head 203 on the basis thereof to carry out focus servo and tracking servo.

The reproduction signal is introduced to the binary value/PLL circuit 206 so that the signal is subjected to a binary value processing for enabling digital processing of the reproduction information, and a reproduction clock is generated at the same time. The generated binary value and the reproduction clock are input to the main controller 208. The main controller 208 comprises a modulating and decoding circuit and an error correcting circuit. The controller 208 also has a servo circuit 207 and a function of controlling the laser controller 209. The controller 208 comprises an interface with the laser controller 209 or the like.

The laser controller 209 is connected to the main controller 208 via a data bus and an address bus. Under control from the main controller 208, each kind of signal is generated which is supplied to a control current terminal 20, current conversion Gain-set terminals 21 and 22, light amount control ON/OFF control terminal 23, a high frequency overlapping ON/OFF terminal 24 or the like shown in FIG. 1.

At the time of recording information onto the optical disk 204, a control current corresponding to information to be recorded is generated with the D/A converter to be input to the LD driving circuit 201. Then the drive current output from the LD driving circuit 201 is supplied to the LD so that laser beams having a higher power than the laser beams at the time of reproduction is output from the LD as writing beams. In a similar manner as at the time of the previous reproduction to be applied on the optical disk 204 from the fixed optical unit 202 via the moving optical head 203 as a fine light spot. With such a structure, information is recorded on the optical disk 204. Such recordable optical disk 204 is not particularly limited to the method. However, for example, an opto-magnetic type disk or a phase-change optical disk is used.

The problem of the prior art can be settled by applying the semiconductor laser device including the LD driving circuit 201 based on the present invention to such optical disk device. That is, since the offset generated in the LD drive circuit can be effectively decreased, damage or erasure of recorded information on the optical disk 204 can be prevented which results from a rise in the output light amount of the LD to a predetermined value or less. At the same time, the S/N reduction of the reproduction signal can be prevented which results from the decrease of the output light amount of the LD to a predetermined value or less.

Furthermore, since the offset can be sufficiently decreased despite the fact that the LD drive circuit 201 is entirely constituted of CMOS transistors as described above, it is possible to easily meet with the request on the decrease in the consumed power of the optical disk and a cost reduction.

Furthermore, the LD drive circuit 201 is constituted in such a manner that an output current of the current/current conversion circuit is changed over and output at a current conversion ratio which is controlled in accordance with a change-over signal from the outside with the current change-over circuit in the input circuit as described above while the value can be easily changed by providing as an external device an LD driving circuit 201 in which a voltage/current conversion resistor is integrated for converting to a voltage a difference current between the control current and the monitor current from the photodetector. Consequently, the circuit can correspond to the type of LD used in the optical system of the optical disk device and a difference in the monitor amount of the optical system for the monitor such as a photodetector or the like with the result that problems such as an increase in the consumed power resulting from the increase and decrease of the input control current and a reduction in the transmission S/N.

According to the semiconductor laser driving circuit and the semiconductor laser device, the conversion ratio in the current change-over circuit can be changed with the control from the outside in accordance with the kind of the semiconductor laser used for a semiconductor laser device and the specification of the optical system for the output light, and at the same time, can convert the external current/voltage conversion resistor. That is, in the optical system of the semiconductor laser device, the magnitude of the monitor current changes with the light emission efficiency of the semiconductor laser itself, the distribution ratio of the semiconductor laser device to the optical system, and the light receiving sensitivity or the like in the photodetector. In the semiconductor laser driving circuit, the control conforming to the magnitude of the monitor current is facilitated. In such a case, problems such as an increase in the consumed power and the reduction in the transmission S/N cease to arise because the input control current is not required to be increased and decreased.

As has been explained above, according to the semiconductor laser driving circuit and the semiconductor laser device of the present invention, since the offset generated in the circuit can be sufficiently decreased, the semiconductor laser can be stably driven in an entirely CMOS circuit structure in which the consumed power and the cost of the circuit are favorable but the generated offset is large, and problems such as erasure of recorded data and the reduction in reproduction S/N can be solved.

Furthermore, in the semiconductor laser driving circuit and the semiconductor laser device of the present invention, the loop gain of the feed-back group can be widely adjusted, and control can be performed which conforms to the magnitude of the monitor current so that there is provided an advantage in that the device can correspond to various specifications of the optical system of the optical device and the device can be universally used.

Additional advantages and modifications will readily occur to those skilled in the art. Therefore, the invention in its broader aspects is not limited to the specific details and representative embodiments shown and described therein. Accordingly, various modifications may be made without departing from the spirit range of the general inventive concept as defined by the appended claims and their equivalents.

What is claimed is:

1. A semiconductor laser driving circuit which drives a semiconductor laser in accordance with an input control current supplied from the outside, the device comprising:

an input circuit configured to convert the input control current into a control current inside of an integrated circuit;

a control amplification circuit configured to amplify a voltage corresponding to a difference current between the control current output from the input circuit and a monitor current corresponding to a light output of the semiconductor laser fed back from a photodetector for detecting the light output;

an output circuit configured to supply a drive current to the semiconductor laser in correspondence to an output from the control amplification circuit;

a first switch configured to interrupt the input control current to the input circuit;

a second switch configured to cut off the output of the control amplification from an input of the output circuit; and an offset compensation circuit configured to detect an offset generated in a signal channel up to the output of the control amplification circuit from an input of the input circuit in the state in which the first switch is operated to interrupt the input control current to the input circuit while the second switch is operated to cut off the output of the control amplification circuit from the input of the output circuit, upon a drive instruction of the semiconductor laser being given and compensate for the offset on the basis of the detection result.

2. The semiconductor laser driving circuit according to claim 1, wherein the offset compensation circuit comprises:

a first comparator configured to compare an output voltage of the control amplification circuit with a reference voltage to output an output signal with a polarity in accordance with the magnitude relationship of the two voltages;

an up/down counter configured to output a digital value by carrying out an up count or a down count in accordance with an output signal polarity of the first comparator;

a D/A converter configured to convert an output digital value from the up/down counter into an analog current to feed back the value to the input circuit;

a filter configured to filter the output signal of the first comparator; and a second comparator configured to judge whether or not an output voltage of the filter is within a predetermined range to determine the timing of the offset detection termination.

3. The semiconductor laser driving circuit according to claim 2, wherein the offset compensation circuit further comprising a timing generator configured to generate a switch control signal for controlling the first switch and the second switch in accordance with a semiconductor laser drive signal and an output from the second comparator, and start or stop supplement of a clock signal to the up/down counter.

4. The semiconductor laser driving circuit according to claim 3, wherein the timing generator controls the first switch to be turned on and the second switch to be connected to the output circuit when the second comparator judges that the output voltage of the filter is within a predetermined range.

5. The semiconductor laser driving circuit according to claim 3, wherein the timing generator starts supplement of the clock signal to the up/down counter when the drive instruction of the semiconductor laser is given and stops supplement of the clock signal to the up/down counter when the second comparator judges that the output voltage of the filter is within a predetermined voltage.

6. The semiconductor laser driving circuit according to claim 1, wherein the input circuit comprises:

a current/current conversion circuit configured to current/current convert the input control current; and a current change-over circuit configured to change over and output an output current from the current/current conversion circuit at a conversion ratio which is controlled on the basis of a control signal from the outside.

7. The semiconductor laser driving circuit according to claim 1, wherein the control amplification circuit comprises:

a differential amplifier having a pair of active loads configured to input a voltage corresponding to a difference current between the output current from the input circuit and the monitor current;

a current distribution circuit configured to distribute a current input respectively to a pair of current input terminals from the pair of active loads at a desired distribution ratio to a pair of current output terminals; and a difference current detection circuit configured to detect and output a difference current of output currents output respectively from the pair of current output terminals; and an output section configured to convert the difference current detected by the difference current detection circuit to a voltage and output the voltage.

8. A semiconductor laser device for driving a semiconductor laser in accordance with an input control current supplied from the outside, the device comprising:

a semiconductor laser;

a photodetector configured to detect a light output of the semiconductor laser;

a current/current conversion circuit configured to convert the input control current into a control current inside of an integrated circuit;

a current change-over circuit configured to change over and outputting the control current output from the current/current conversion circuit at a conversion ratio which is controlled on thee basis of a control signal from the outside;

a control amplification circuit configured to amplify a voltage corresponding to a difference current between a control current output from the current change-over circuit and a monitor current corresponding to the light output of the semiconductor laser fed back from the photodetector; and an output circuit configured to supply a drive current to the semiconductor laser in correspondence to an output from the control amplification circuit;

wherein the current/current conversion circuit, the current change-over circuit, the control amplification circuit, and the output circuit are constituted of the integrated circuit; and the device further comprising:

a current/voltage conversion resistor configured to convert the difference current between the control current and the monitor current into a voltage to supply the voltage to the control amplification circuit.

9. The semiconductor laser device according to claim 8, further comprising:

a first switch provided upstream of the current/current conversion circuit;

a second switch provided between the control amplification circuit and the output circuit; and an offset compensation circuit configured to compensate for an offset generated in a signal channel from an input of the current/current conversion circuit up to an output of the control amplification circuit.

10. The semiconductor laser device according to claim 9, wherein the offset compensation circuit comprises:

a first comparator configured to compare an output voltage of the control amplification circuit with a reference voltage to output an output signal with a polarity in accordance with the magnitude relationship of the two voltages;

an up/down counter configured to output a digital value by carrying out an up count or a down count in accordance with an output signal polarity of the first comparator;

a D/A converter configured to convert an output digital value from the up/down counter into an analog current to feed back the digital value to the current/current conversion circuit;

a filter configured to filter the output signal of the first comparator; and a second comparator configured to judge whether or not an output voltage of the filter is within a predetermined range to determine the offset detection termination timing.

11. The semiconductor laser according to claim 10, wherein the offset compensation circuit further comprises a timing generator configured to generate a switch control signal for controlling the first switch and the second switch in accordance with a semiconductor laser drive signal and an output from the second comparator, and start or stop supplement of a clock signal to the up/down counter.

12. The semiconductor laser device according to claim 8, wherein the control amplification circuit comprises:

a differential amplifier having a pair of active loads configured to input a voltage corresponding to a difference current between the control current output from the current/current conversion circuit and the monitor current;

a current distribution circuit configured to distribute a current input respectively to a pair of current input terminals from the pair of active loads at a desired distribution ratio to a pair of current output terminals;

a difference current detection circuit configured to detect and output a difference current of output currents output respectively from the pair of current output terminals; and an output section configured to convert the difference current detected by the difference current detection circuit into a voltage and output the voltage.

13. A semiconductor laser device for driving a semiconductor laser in accordance with an input control current supplied from the outside, the device comprising:

a semiconductor laser;

a photodetector configured to detect a light output of the semiconductor laser;

an input circuit configured to convert the input control current into a control current inside of an integrated circuit;

a control amplification circuit configured to amplify a voltage corresponding to a difference current between the control current output from the input circuit and a monitor current corresponding to the light output of the semiconductor laser fed back from the photodetector;

an output circuit configured to supply a drive current to the semiconductor laser in correspondence to an output from the control amplification circuit;

a first switch configured to interrupt the input control current to the input circuit;

a second switch configured to cut off the output of the control amplification circuit from an input of the output circuit; and an offset compensation circuit configured to detect an offset generated in a signal channel up to the output of the control amplification circuit from an input of the input circuit in the state in which the first switch is operated to interrupt the input control current to the input circuit while the second switch is operated to cut off the output of the control amplification circuit from the input of the output circuit, upon a drive instruction of the semiconductor laser being given and compensate for the offset on the basis of the detection result.

14. The semiconductor laser device according to claim 13, wherein the offset compensation circuit comprises:

a first comparator configured to compare an output voltage of the control amplification circuit with a reference voltage to output an output signal with a polarity in accordance with the magnitude relationship of the two voltages;

an up/down counter configured to output a digital value by carrying out an up count or a down count in accordance with a polarity of the output signal of the first comparator;

a D/A converter configured to convert an output digital value from the up/down counter into an analog current to feed back the value to the input circuit;

a filter configured to filter the output signal of the first comparator;

a second comparator configured to judge whether or not an output voltage of the filter is within a predetermined range to determine the timing of the offset detection termination.

15. The semiconductor laser device according to claim 14, wherein the offset compensation circuit further comprises a timing generator configured to generate a switch control signal for controlling the first switch and the second switch in accordance with a semiconductor laser drive signal and an output from the second comparison circuit, and start or stop supplement of a clock signal to the up/down counter.

16. The semiconductor laser device according to claim 15, wherein the timing generator controls the first switch to be turned on and the second switch to be connected to the output circuit when the second comparator judges that the output voltage of the filter is within a predetermined range.

17. The semiconductor laser device according to claim 15, wherein the timing generator starts supplement of the clock signal to the up/down counter when the drive instruction of the semiconductor laser is given and stops supplement of the clock signal to the up/down counter when the second comparator judges that the output voltage of the filter is within a predetermined voltage.

18. The semiconductor laser device according to claim 13, wherein the input circuit comprises:
- a current/current conversion circuit configured to current/current convert the input control current; and
- a current change-over circuit configured to change over and output and output current from the current/current conversion circuit at a conversion ratio which is controlled on the basis of a control signal from the outside.

19. The semiconductor laser device according to claim 13, wherein the control amplification circuit comprises:
- a differential amplification circuit having a pair of active loads configured to input a voltage corresponding to a difference current between the output current from the input circuit and the monitor current;
- a current distribution circuit configured to distribute a current input respectively to a pair of current input terminals from the pair of active loads at a desired distribution ratio to a pair of current output terminals;
- a difference current detection circuit configured to detect and output a difference current of output currents output respectively from the pair of current output terminals; and
- an output section configured to convert the difference current detected by the difference current detection circuit into a voltage to output the voltage.

20. The semiconductor laser device according to claim 13, wherein the input circuit, the control amplification circuit, the output circuit, the first and second switches, and the offset compensation circuit are comprised as an integrated circuit.

* * * * *